United States Patent [19]

Bearinger et al.

[11] Patent Number: 5,904,791
[45] Date of Patent: May 18, 1999

[54] USE OF PRECERAMIC POLYMERS AS ELECTRONIC ADHESIVES

[75] Inventors: Clayton R. Bearinger; Robert Charles Camilletti; Grish Chandra, all of Midland, Mich.; Theresa Eileen Gentle, York, Pa.; Loren Andrew Haluska, Midland, Mich.

[73] Assignee: Dow Corning Corporation, Midland, Mich.

[21] Appl. No.: 08/867,300

[22] Filed: Jun. 2, 1997

Related U.S. Application Data

[63] Continuation of application No. 08/533,217, Sep. 25, 1995, abandoned.

[51] Int. Cl.$^6$ ............................... B32B 31/26; H05K 7/02
[52] U.S. Cl. ..................................... 156/89.11; 156/89.12; 156/89.28; 361/760; 361/764
[58] Field of Search ............................ 156/89.11, 89.12, 156/89.28; 361/760, 764

[56] References Cited

U.S. PATENT DOCUMENTS

| | | | |
|---|---|---|---|
| 4,221,826 | 9/1980 | Baltrushaitis et al. | 427/96 |
| 4,255,316 | 3/1981 | Blizzard . | |
| 4,422,891 | 12/1983 | Gonser . | |
| 4,808,653 | 2/1989 | Haluska et al. . | |
| 4,849,296 | 7/1989 | Haluska et al. . | |
| 4,943,468 | 7/1990 | Gordon et al. . | |
| 4,973,526 | 11/1990 | Haluska et al. . | |
| 5,059,448 | 10/1991 | Chandra et al. . | |
| 5,073,840 | 12/1991 | Coors | 361/760 |
| 5,256,487 | 10/1993 | Myers . | |
| 5,262,201 | 11/1993 | Chandra et al. . | |
| 5,336,532 | 8/1994 | Haluska et al. . | |
| 5,407,504 | 4/1995 | Ewart-Paine . | |
| 5,530,293 | 6/1996 | Cohen et al. . | |
| 5,601,675 | 2/1997 | Hoffmeyer et al. . | |
| 5,616,202 | 4/1997 | Camilletti et al. . | |

FOREIGN PATENT DOCUMENTS

| | | |
|---|---|---|
| 0 764 704 | 3/1997 | European Pat. Off. . |
| 54-134744 | 10/1979 | Japan . |
| 57-067083 | 4/1982 | Japan . |
| 62-233508 | 10/1987 | Japan . |
| 3-119087 | 5/1991 | Japan . |

OTHER PUBLICATIONS

DeLeeuw, D.; "Effects of Joining Pressure and Deformation on the Strength and Microstructure of Diffusion–Bonded Silicon Carbide", J. Am. Ceram. Soc. (1992) pp. 725–727, vol. 75, No. 3.

Yajima, S. et al., "Joining of SiC to SiC Using Polyborosiloxane", Oarai Branch, Research Institute for Iron, Steel and Other Metals, Tohoku University, Oarai, Ibaraki–ken, 311–13 Japan, vol. 60, No. 2 (1981).

*Primary Examiner*—Curtis Mayes
*Attorney, Agent, or Firm*—Sharon K. Severance

[57] ABSTRACT

A method of adhering an electronic component to substrate in which a layer of a preceramic polymer is applied between the electronic component and the substrate to which it is to be adhered followed by heating to convert the preceramic polymer into a ceramic. The method forms a strong bond which is not affected by the environment. The method is valuable for adhering integrated circuit chips to carriers or circuit boards.

5 Claims, No Drawings

US 5,904,791

USE OF PRECERAMIC POLYMERS AS ELECTRONIC ADHESIVES

This application is a continuation of application Ser. No. 08/533,217 filed Sep. 25, 1995 which application is now abandoned.

BACKGROUND OF THE INVENTION

The present invention relates to the use of preceramic polymers as adhesives in the electronics industry. These adhesives form secure bonds between electronic components which are not subject to degradation.

Conventionally, electronic components have been interconnected with substrates such as carriers or circuit boards with metallic solders. Such solders are advantageous in that they form high strength bonds with excellent electrical and thermal conductivity. Moreover, such bonds can be formed quickly at a low cost.

The use of solder, however, has a number of drawbacks. For instance, solder is generally applied at high temperatures which can damage either the electronic component or the substrate. Moreover, the processes used for applying these solders are very sensitive such that temperature control, cleaning, fluxing, etc. are critical to prevent problems such as corrosion, weak joints, stress cracking and the like.

To overcome these problems, a number of polymer based alternatives have been suggested. They include materials such as epoxies, acrylic resins and silicones which can be filled with conductive particles and used to adhere electronic components to substrates. These polymers have he advantage of low temperature curing, simplified processing and they form strong, electrically conductive bonds which have fatigue and shock resistance.

The polymer alternatives have additional advantages and utilities in the electronic industry. For instance, unfilled polymers can be used as potting compounds to merely adhere large electrical components to the circuit board. Similarly, the polymers can be filled with materials that are excellent thermal conductors to distribute heat away from temperature sensitive devices.

The polymer alternatives, however, also have disadvantages. For instance, the polymer application techniques are sensitive to factors such as polymer concentration, solvent type, polymer temperature and the like. Moreover, the cure process which is necessary to harden polymers is sensitive to factors such as temperature, humidity, air concentrations and contaminants. Finally, the hardened polymers are often sensitive to the elevated temperatures seen in subsequent processing of the electronic component.

The use of preceramic polymers as adhesives is also known in the art. For instance, such polymers have been used to adhere a variety of materials such as plastics, ceramics and the like. It was not, however, known to use such materials to adhere electrical components to substrates.

The present inventors have now discovered that preceramic polymers can be used to form secure ceramic bonds between electronic components.

SUMMARY OF THE INVENTION

The present invention relates to a method of adhering an electronic component to a substrate. The method comprises providing an electronic component and a substrate, wherein the electronic component has a surface to be adhered to a surface on the substrate. A layer of a preceramic polymer is then applied between the surfaces to be adhered. The surfaces to be adhered are then joined to form an assembly comprising the electronic component and the substrate with the preceramic polymer therebetween. The assembly is then heated to a temperature sufficient to convert the preceramic polymer into a ceramic.

DETAILED DESCRIPTION OF THE INVENTION

The present invention is based on the unexpected discovery that a preceramic polymer can be used to form a ceramic bond between an electronic component and a substrate. This bond is easy to form, secure, and not subject to degradation by temperature or the environment.

Essentially, the process of the present invention comprises positioning a layer of a preceramic polymer between the electronic component and the substrate to which it is to be adhered followed by heating to convert the preceramic polymer into a ceramic.

As used in the present invention, the "electronic components" described herein are not particularly limited. They include, but are not limited to, electronic devices or electronic circuits such as silicon based devices, gallium arsenide based devices, focal plane arrays, opto-electronic devices, photovoltaic cells and optical devices. Likewise, the "substrates" described herein are not particularly limited and can include circuit boards, chip carriers, and the like. Preferred in the present invention is the attachment of integrated circuit chips or chip carriers to circuit boards.

As used herein, the expression "preceramic polymer" is used to describe silicon-containing polymers which can be converted to ceramics by heating. Any such polymer which can be applied to a surface and so converted is within the scope of the present invention. These preceramic polymers are known in the art and can be manufactured by known techniques. Examples of suitable polymers within the scope of this invention include polysiloxanes, polysilazanes, polysilanes, and polycarbosilanes.

If the organosilicon polymer is a polysiloxane, it may contain units of general structure $[R_3SiO_{0.5}]$, $[R_2SiO]$, $[RSiO_{1.5}]$, and $[SiO_2]$ where each R is independently selected from the group consisting of hydrogen, alkyl radicals containing 1 to 20 carbon atoms such as methyl, ethyl, propyl etc., aryl radicals such as phenyl, and unsaturated alkyl radicals such as vinyl. Examples of specific polysiloxane groups include $[PhSiO_{1.5}]$, $[MeSiO_{1.5}]$, $[HSiO_{1.5}]$, $[MePhSiO]$, $[Ph_3SiO]$, $[PhViSiO]$ $[ViSiO_{1.5}]$, $[MeHSiO]$, $[MeViSiO]$, $[Me_2SiO]$, $[Me_2SiO_{0.5}]$, and the like. Mixtures or copolymers of polysiloxanes may also be employed.

The polysiloxanes of this invention can be prepared by techniques well known in the art. The actual method used to prepare the polysiloxanes is not critical. Most commonly, the polysiloxanes are prepared by the hydrolysis of chlorosilanes. Such methods, as well as others, are described in Noll, *Chemistry and Technology of Silicones,* chapter 5 (translated 2d Ger. Ed., Academic Press, 1968).

The polysiloxane may also be substituted with various metallo groups (i.e., containing repeating metal-O—Si units). Examples of suitable compounds include borosiloxanes and aluminosiloxanes which are both well known in the art. For instance, Noll, *Chemistry and Technology of Silicones,* chapter 7, (translated 2d Ger. Ed., Academic Press, 1968) describes numerous polymers of this type as well as their method of manufacture. Additional examples include Japanese Kokai Patent No. Sho 54[1979]-134744 granted to Tamamizu et al., U.S. Pat. No. 4,455,414 granted to Yajima et al. and U.S. Pat. No. 5,112,779 granted to Burns et al. All of these references are hereby incorporated by reference.

Preferred polysiloxanes are the silsesquioxanes ($RSiO_{1.5}$). Examples of suitable silsesquioxanes are alkyl silsesquioxanes, aryl silsesquioxanes and hydrogen silsesquioxane. Especially preferred are hydrogen silsesquioxane resins ("H-resin"). These include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, x=0–2, y=0–2, z=1–3, x+y+z=3. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein. If the preceramic organosilicon polymer is a polysilazane, it may contain units of the type $[R_2SiNH]$, $[R_3Si(NH)_{1/2}]$, $[RSi(NH)_{1.5}]$, and/or

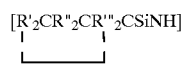

where each R is independently selected from the group consisting of hydrogen, alkyl radicals containing 1 to 20 carbon atoms such as methyl, ethyl, propyl etc., aryl radicals such as phenyl, and unsaturated hydrocarbon radicals such as vinyl and each R', R", and R'" is independently selected from the group consisting of hydrogen, alkyl radicals having 1 to 4 carbon atoms, aryl radicals such as phenyl, and unsaturated hydrocarbon radicals such as vinyl. Examples of specific polysilazane units include $[Ph_3SiNH]$, $[PhSi(NH)_{1.5}]$,

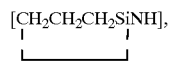

$[ViSi(NH)_{1.5}]$, $[Vi_2SiNH]$, $[PhMeSiNH]$, $[HSi(NH)_{1.5}]$, $[PhViSiNH]$, $[MeSi(NH)_{1.5}]$, $[Me_3SiNH]$, $[H_2SiNH]$, $[CH_3Si(NH)_{1.5}]$ $[MeViSiNH]$, and the like.

The polysilazanes of this invention can be prepared by techniques well known in the art. The actual method used to prepare the polysilazane is not critical. Suitable polysilazanes may be prepared by the methods of Gaul in U.S. Pat. No. 4,312,970 (issued Jan. 26, 1982), U.S. Pat. No. 4,340,619 (issued Jul. 20, 1982), U.S. Pat. No. 4,395,460 (issued Jul. 26, 1983), and U.S. Pat. No. 4,404,153 (issued Sep. 13, 1983), all of which are hereby incorporated by reference. Suitable polysilazanes also include those prepared by the methods of Haluska in U.S. Pat. No. 4,482,689 (issued Nov. 13, 1984) and Seyferth et al. in U.S. Pat. No. 4,397,828 (issued Aug. 9, 1983), both of which are hereby incorporated by reference. Other polysilazanes suitable for use in this invention can be prepared by the methods of Cannady in U.S. Pat. No. 4,540,803 (issued Sep. 10, 1985), U.S. Pat. No. 4,543,344 (issued Sep. 24, 1985), Burns et al. in J. Mater. Sci, 22 (1987), pp 2609–2614, and Burns in U.S. Pat. Nos. 4,835,238, 4,774,312, 4,929,742 and 4,916,200, which are all incorporated herein in their entirety.

The preferred polysilazanes to be used herein are those of Cannady in U.S. Pat. No. 4,540,803 which are prepared by contacting and reacting in an inert essentially anhydrous atmosphere, trichlorosilane with a disilazane at a temperature in the range of 25° C. to 300° C. while distilling volatile byproducts. The disilazane used in the process has the formula $(R_3Si)_2NH$ where R is selected from the group consisting to vinyl, hydrogen, phenyl and alkyl radicals containing 1 to 3 carbon atoms. An especially preferred embodiment of the Cannady invention involves the reaction of trichlorosilane with hexamethyldisilazane to produce hydridopolysilazane.

The polysilazane may also be substituted with various metal groups (i.e., containing repeating metal-N—Si units). Examples of suitable compounds include borosilazanes which are known in the art. These include, but are not limited to, those described in U.S. Pat. No. 4, 910,173 granted to Niebylski, those described by Haluska in U.S. Pat. No. 4,482,689, those described by Zank in U.S. Pat. Nos. 5,164,344, 5,252,684 and 5,169,908, those described by Funayama et al., in U.S. Pat. No. 5,030,744, those described by Seyferth et al., J. Am. Ceram. Soc. 73, 2131–2133 (1990), those described by Noth, B. Anorg. Chem. Org. Chem., 16(9), 618–21, (1961), and those described by Araud et al. in European Patent No. 364,323, which are all incorporated herein by reference in their entirety.

If the preceramic organosilicon polymer is a polysilane, it may contain units of general structure $[R_3Si]$, $[R_2Si]$, and $[RSi]$ where each R is independently selected from the group consisting of hydrogen, alkyl radicals containing 1 to 20 carbon atoms such as methyl, ethyl, propyl etc., aryl radicals such as phenyl, and unsaturated hydrocarbon radicals such as vinyl. Examples of specific polysilane units are $[Me_2Si]$, $[PhMeSi]$, $[MeSi]$, $[PhSi]$, $[ViSi]$, $[PhMeSi]$, $[MeHSi]$, $[MeViSi]$, $[Ph_3Si]$, $[Me_2Si]$, $[Me_3Si]$, and the like.

The polysilanes of this invention can be prepared by techniques well known in the art. The actual method used to prepare the polysilanes is not critical. Suitable polysilanes may be prepared by the reaction of organohalosilanes with alkali metals as described in Noll, Chemistry and Technology of Silicones, 347–49 (translated 2d Ger. Ed., Academic Press, 1968). More specifically, suitable polysilanes may be prepared by the sodium metal reduction of organosubstituted chlorosilanes as described by West in U.S. Pat. No. 4,260,780 and West et al. in 25 Polym. Preprints 4 (1984), both of which are incorporated by reference. Other suitable polysilanes can be prepared by the general procedures described in Baney, et al., U.S. patent application Ser. No. 4,298,559 which is incorporated by reference.

The polysilane may also be substituted with various metal groups (i.e., containing repeating metal-Si units). Examples of suitable metals to be included therein include boron, aluminum, chromium and titanium. The method used to prepare said polymetallosilanes is not critical. It may be, for example, the method of Chandra et al. in U.S. Pat. No. 4,762,895 or Burns et al. in U.S. Pat. No. 4,906,710, both of which are incorporated by reference.

If the preceramic organosilicon polymer is a polycarbosilane, it may contain units of the type $[R_2SiCH_2]$, $[RSi(CH\ 2)_{1.5}]$, and/or $[R_3Si(CH_2)_{0.5}]$ where each R is independently selected from the group consisting of hydrogen, alkyl radicals containing 1 to 20 carbon atoms such as methyl, ethyl, propyl etc., aryl radicals such as phenyl, and unsaturated hydrocarbon radicals such as vinyl. Suitable polymers are described, for instance, by Yajima et al. in U.S. Pat. Nos. 4,052,430 and 4,100,233, both of which are incorporated herein in their entirety. Polycarbosilanes containing repeating (—$SiHCH_3$—$CH_2$—) units can be purchased commercially from the Nippon Carbon Co.

The polycarbosilane may also be substituted with various metal groups such as boron, aluminum, chromium and titanium. The method used to prepare such polymers is not critical. It may be, for example, the method of Yajima et al. in U.S. Pat. Nos. 4,248,814, 4,283,376 and 4,220,600.

Other materials which form ceramics can also be used herein. For instance, oxide precursors such as compounds of various metals such as aluminum, titanium, zirconium, tantalum, niobium and/or vanadium as well as various non-metallic compounds such as those of boron or phosphorous which may be pyrolyzed at relatively low temperatures are within the scope of the present invention and included within the definition of "preceramic polymers". Specific compounds include zirconium tetracetylacetonate, titanium dibutoxy diacetylacetonate, aluminum triacetylacetonate and tetraisobutoxy titanium.

If desired, particulate fillers can be added to the preceramic polymer to modify the characteristics of the resultant ceramic. For instance, metals such as gold, silver, platinum, aluminum, copper, and the like can be added to render the ceramic electrically conductive. Similarly, fillers such as the oxides, nitrides, borides and carbides of various metals and non-metals (eg., glass, alumina, silica, titanium dioxide, SiC, SiN, AlN, $B_4C$, ZrB, ZrC) can be added to modify properties and characteristics such as thermal conductivity, viscosity of the polymer, color, etc. Such fillers and their uses are known in the art. Generally, if fillers are used, they are added in amounts of about 1–90 wt. %.

Still other materials may be present in the coating compositions of the invention. For instance, adhesion promoters such as glycidoxypropyltrimethoxysilane, mercaptopropyltrimethoxysilane, and vinyltriacetoxysilane and suspending agents are known to those skilled in the art and can be included herein in amounts of about 1–20 wt %.

A layer of the preceramic polymer and any fillers is applied between the surface of the electronic component to be bonded and the surface of the substrate to be bonded. This can be accomplished in any desirable manner, but a preferred method involves dissolving or dispersing the preceramic polymer in a solvent and applying the mixture to the surface of either the electronic component or the substrate by a means such as drop dispensing, dip coating, spray coating or flow coating followed by evaporating the solvent. Other equivalent means such as melt coating are also deemed to be within the scope of this invention.

Generally the two surfaces to be bonded are then brought together with the layer of preceramic polymer therebetween. If desired, pressure can be applied and maintained to more firmly bond the component to the substrate.

The preceramic polymer is then typically converted to the ceramic by heating it to a sufficient temperature. Generally, the temperature is in the range of about 50 to about 1000° C. depending on the pyrolysis atmosphere and the polymer. Preferred temperatures are in the range of about 50 to about 800° C. and more preferably 100–500° C. Heating is generally conducted for a time sufficient to ceramify, generally up to about 6 hours, with less than about 3 hours being preferred (eg., 5 minutes-3 hrs).

The above heating may be conducted at any effective atmospheric pressure from vacuum to superatmospheric and under any effective oxidizing or non-oxidizing gaseous environment such as those comprising air, $O_2$, ozone, an inert gas ($N_2$, Ar etc.), ammonia, amines, moisture, $N_2O$, $H_2$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

When the heating is complete, the ceramic forms a strong bond between the electronic component and the substrate. This bond can have a variety of physical and electrical properties (conductive to dielectric) depending on any fillers or additives which may have been used. Moreover, the bond is resistant to damage by the environment, temperature, chemicals and physical manipulation.

The following non-limiting examples are included so that one skilled in the art may more readily understand the invention.

EXAMPLE 1

Hydrogen silsesquioxane resin, 12 g, produced by the method of Collins et al. in U.S. Pat. No. 3,615,272, 36 g of plasma alumina microballoons (6 micrometer), 3 g glycidoxypropyltrimethoxysilane and 15 g dimethylcyclosiloxanes were mixed to form a thick paste adhesive. Aluminum panels, 2.5×7.5×0.16 cm, were used to test adhesive strength. The panels were cleaned with toluene and then placed in an ultraviolet ozone cleaning system for 15 minutes. About 5 mL of the adhesive paste was placed in the center of one of the panels and a second panel was placed cross-wise on the first panel to form a cross with a 2.5 sq. cm center area that bonded the 2 panels together. A 50 g weight was placed on the center area and the bonded panels were pyrolyzed at 400° C. for either 1 or 4 hours. An Instron Testing Machine with a 4.5 kg load cell and a pull rate of 0.625 cm/min. was used to determine the adhesive bond strength. The results are as follows:

| 400° C./1 hour | 400° C./4 hours |
| --- | --- |
| Adhesive 322 g/sq. cm Strength (2 sample average) | 420 g/sq. cm (4 sample average) (1 sample > 700 g/sq cm) |

EXAMPLE 2

Hydridopolysilazane (50 wt % solids in xylene), 12 g, made by the method of Cannady in U.S. Pat. No. 4,540,803, 28 g of plasma alumina microballoons (6 micrometer), 1.5 g glycidoxypropyltrimethoxysilane and 3.5 g dimethylcyclosiloxanes were mixed to form a thick paste adhesive. The same aluminum panels of Example 1 (2.5×7.5×0.16 cm) were cleaned, adhered, pyrolyzed and tested in the same manner as Example 1. The results are as follows:

| 400° C./1 hour | 400° C./4 hours |
|---|---|
| Adhesive 350 g/sq. cm Strength (2 sample average) | 150 g/sq. cm (4 sample average) (1 sample > 700 g/sq cm) |

EXAMPLE 3

Hydrogen silsesquioxane resin produced by the method of Collins et al. in U.S. Pat. No. 3,615,272 was diluted to 10 wt. % in toluene. 50 ppm platinum based on the weight of H-resin was added to the solution. This solution was applied to the unpolished side of a silicon wafer and the unpolished side of a second wafer was applied on top of it. The bonded wafers were pyrolyzed at 400° C. for 1.5 hours. The 2 wafers stuck together very well and could not be broken apart by applying lateral force.

EXAMPLE 4

Hydrogen silsesquioxane resin produced by the method of Collins et al. in U.S. Pat. No. 3,615,272 was diluted to 10 wt. % in toluene. 50 ppm platinum based on the weight of H-resin was added to the solution. This solution was applied to the polished side of 4 silicon wafers and the polished side of 4 other wafers were applied on top of them. The bonded wafers were pyrolyzed at 400° C. for 1.5 hours. 3 of the 4 wafer sets stuck together and 1 wafer set cracked and did not adhere.

That which is claimed is:

1. A method of adhering an electronic component to a substrate comprising:

providing an integrated circuit chip and a substrate selected from the group consisting of a chip carrier and a circuit board, wherein the integrated circuit chip and substrate each have a surface to be adhered to the other;

applying a layer of a composition comprising a hydrogen silsesquioxane resin between the surfaces to be adhered;

joining the surfaces to be adhered to form an assembly comprising the integrated circuit chip and the substrate with the hydrogen silsesquioxane resin therebetween; and heating the assembly to a temperature sufficient to convert the hydrogen silsesquioxane resin to a ceramic.

2. The method of claim 1 wherein the composition comprising the hydrogen silsesquioxane resin also contains a solvent.

3. The method of claim 1 wherein the composition comprising the hydrogen silsesquioxane resin also contains a filler.

4. The method of claim 1 wherein the assembly is heated at a temperature in the range of between about 150 and about 600° C. for between about 5 minutes and about 6 hours.

5. A method of adhering an electronic component to a substrate comprising:

providing an integrated circuit chip carrier and a circuit board, wherein the integrated circuit chip carrier and circuit board each have a surface to be adhered to the other;

applying a layer of a composition comprising a hydrogen silsesquioxane resin between the surfaces to be adhered;

joining the surfaces to be adhered to form an assembly comprising the integrated circuit chip carrier and the circuit board with the hydrogen silsesquioxane resin therebetween; and heating the assembly to a temperature sufficient to convert the hydrogen silsesquioxane resin to a ceramic.

* * * * *